United States Patent
Miao et al.

(10) Patent No.: US 10,756,216 B2
(45) Date of Patent: Aug. 25, 2020

(54) NANOSHEET MOSFET WITH ISOLATED SOURCE/DRAIN EPITAXY AND CLOSE JUNCTION PROXIMITY

(71) Applicant: International Business Machines Corporation, Armonk, NY (US)

(72) Inventors: Xin Miao, Guilderland, NY (US); Alexander Reznicek, Troy, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/059,101

(22) Filed: Aug. 9, 2018

(65) Prior Publication Data
US 2020/0052124 A1    Feb. 13, 2020

(51) Int. Cl.
*H01L 29/78*    (2006.01)
*H01L 29/06*    (2006.01)
(Continued)

(52) U.S. Cl.
CPC .. *H01L 29/7856* (2013.01); *H01L 21/823418* (2013.01); *H01L 21/823431* (2013.01);
(Continued)

(58) Field of Classification Search
CPC ......... H01L 29/7856; H01L 21/823418; H01L 21/823468; H01L 29/0649;
(Continued)

(56) References Cited

U.S. PATENT DOCUMENTS

| | | | |
|---|---|---|---|
| 5,187,110 A * | 2/1993 | Aina ................... | H01L 27/0605 148/DIG. 9 |
| 6,852,575 B2 | 2/2005 | Bojarczuk, Jr. et al. | |
| 9,666,693 B1 | 5/2017 | Doris et al. | |
| 9,881,998 B1 | 1/2018 | Cheng et al. | |
| 9,947,804 B1 | 4/2018 | Frougier et al. | |
| 2014/0151639 A1* | 6/2014 | Chang ............... | H01L 29/42392 257/27 |

(Continued)

OTHER PUBLICATIONS

Gaben, L., "Fabrication and Characterization of Gate-All-Around Stacked-Nanowire/Nanosheet MOS transistors realized by a Gate-Last approach for sub-7 nm technology nodes", Micro and nanotechnologies/ Microelectronics. Université Grenoble Alpes, submitted Apr. 27, 2018, 149 pages.
(Continued)

*Primary Examiner* — Mohammad M Hoque
(74) *Attorney, Agent, or Firm* — Scully, Scott, Murphy & Presser, P.C.; L. Jeffrey Kelly, Esq.

(57) ABSTRACT

A sacrificial inner dielectric spacer is formed on physically exposed sidewalls of each recessed semiconductor channel material nanosheet of a nanosheet material stack that further includes recessed sacrificial semiconductor material nanosheets that have an inner dielectric spacer formed on physically exposed sidewalls thereof. A local isolation region is then formed by selective epitaxial growth on a surface of a semiconductor substrate containing the nanosheet material stack. After forming the local isolation region, the sacrificial inner dielectric spacers are removed and a source/drain region is formed on the physically exposed surface of each recessed semiconductor channel material nanosheet. A portion of the source/drain structure is formed in a gap located between each neighboring pair of vertically spaced apart inner dielectric spacers.

9 Claims, 7 Drawing Sheets

(51) Int. Cl.
   *H01L 29/66*      (2006.01)
   *H01L 21/8234*    (2006.01)
   *H01L 23/532*     (2006.01)
   *H01L 29/423*     (2006.01)
(52) U.S. Cl.
   CPC .......... *H01L 21/823468* (2013.01); *H01L 21/823481* (2013.01); *H01L 23/5329* (2013.01); *H01L 29/0649* (2013.01); *H01L 29/0673* (2013.01); *H01L 29/66545* (2013.01); *H01L 29/66553* (2013.01); *H01L 29/66795* (2013.01); *H01L 29/42356* (2013.01); *H01L 2029/7858* (2013.01)
(58) Field of Classification Search
   CPC ......... H01L 21/823481; H01L 23/5329; H01L 29/66795; H01L 29/66553; H01L 21/823431; H01L 29/66545; H01L 29/0673; H01L 2029/7858; H01L 29/42356
   See application file for complete search history.

(56) References Cited

U.S. PATENT DOCUMENTS

| | | | |
|---|---|---|---|
| 2015/0372097 A1* | 12/2015 | Bao | H01L 29/0607 257/201 |
| 2016/0225768 A1* | 8/2016 | Cheng | H01L 21/76281 |
| 2017/0110554 A1 | 4/2017 | Tak et al. | |
| 2017/0170294 A1* | 6/2017 | Doris | H01L 29/267 |
| 2017/0213905 A1 | 7/2017 | Lee et al. | |
| 2018/0083045 A1 | 3/2018 | Leobandung | |
| 2018/0366562 A1* | 12/2018 | Wu | H01L 29/66795 |

OTHER PUBLICATIONS

Zhao, Y., et al., "Dielectric and electrical properties of amorphous La1—xTaxOy films as higher-k gate insulators", Journal of Applied Physics, published online Feb. 5, 2009, pp. 034103-1 to 034103-5, 105.

* cited by examiner

NANOSHEET MOSFET WITH ISOLATED SOURCE/DRAIN EPITAXY AND CLOSE JUNCTION PROXIMITY

BACKGROUND

The present application relates to a semiconductor structure and a method of forming the same. More particularly, the present application relates to a semiconductor structure containing a nanosheet containing device in which parasitic leakage current under a vertical stack of semiconductor channel nanosheets is prevented. The present application also relates to a method of forming such a semiconductor structure.

The use of non-planar semiconductor devices such as, for example, a nano sheet containing device is the next step in the evolution of complementary metal oxide semiconductor (CMOS) devices. By "nanosheet containing device" it is meant that the device contains one or more layers of semiconductor channel material portions (i.e., nanosheets) having a vertical thickness that is substantially less than its width. Nanosheet containing device formation relies on the selective removal of one semiconductor material (e.g., a silicon germanium alloy) to another semiconductor material (e.g., silicon) to form suspended nanosheets for gate-all-around devices.

In current nanosheet containing devices, the functional gate structure that wraps around the bottommost semiconductor channel material nanosheet also touches the semiconductor substrate which can lead to potential leakage paths. Also, and in current nanosheet containing devices, the source/drain regions are not in close proximity to the channel of the nanosheet containing device. There is thus a need for providing nanosheet containing devices having a local isolation region under the source/drain region to prevent parasitic leakage current under the channel and with source/drain epitaxy in close proximity to the channel so as to obtain sharp source/drain junctions.

SUMMARY

A sacrificial inner dielectric spacer is formed on physically exposed sidewalls of each recessed semiconductor channel material nanosheet of a nanosheet material stack that further includes recessed sacrificial semiconductor material nanosheets that have an inner dielectric spacer formed on physically exposed sidewalls thereof. A local isolation region is then formed by selective epitaxial growth on a surface of a semiconductor substrate containing the nanosheet material stack. After forming the local isolation region, the sacrificial inner dielectric spacers are removed and a source/drain region is formed on the physically exposed surface of each recessed semiconductor channel material nanosheet. A portion of the source/drain structure is formed in a gap located between each neighboring pair of vertically spaced apart inner dielectric spacers.

In one aspect of the present application, a semiconductor structure is provided in which parasitic leakage current under a stack of semiconductor channel nanosheets is prevented, while containing a source/drain structure that is in close proximity to the semiconductor channel nanosheets. In one embodiment, the semiconductor structure includes a plurality of stacked and suspended semiconductor channel nanosheets located above a semiconductor substrate. A functional gate structure surrounds a portion of each semiconductor channel nanosheet of the plurality of stacked and suspended semiconductor channel nanosheets. An inner dielectric spacer is located on a sidewall of the functional gate structure and present above and beneath each semiconductor channel nanosheet of the plurality of stacked and suspended semiconductor channel nanosheets. A source/drain (S/D) structure is located on each side of the functional gate structure. In accordance with the present application, a portion of the S/D structure physically contacts a sidewall of each of the semiconductor channel nanosheets and is present in a gap located between each neighboring pair of vertically spaced apart inner dielectric spacers. A local isolation region is present between the source/drain structure and the semiconductor substrate.

In another aspect of the present application, a method of forming such a semiconductor structure is provided. In one embodiment, the method includes forming a nanosheet material stack of alternating nano sheets of a sacrificial semiconductor material and a semiconductor channel material beneath a sacrificial gate structure and a dielectric spacer and on a semiconductor substrate. Each of the sacrificial semiconductor material nanosheets is then recessed to provide recessed sacrificial semiconductor material nanosheets, and an inner dielectric spacer is formed on physically exposed sidewalls of each of the recessed sacrificial semiconductor material nanosheets. Next, each of the semiconductor channel material nanosheets is recessed to provide recessed semiconductor channel material nanosheets, and thereafter a sacrificial inner dielectric spacer is formed on physically exposed sidewalls of each of the recessed semiconductor channel material nano sheets. A local isolation region is then formed on a surface of the semiconductor substrate adjacent to the nanosheet material stack. Each of the inner dielectric spacers is removed to physically expose sidewalls of the recessed semiconductor channel material nanosheets, and thereafter a source/drain structure is formed on each side of the nanosheet material stack and on the physically exposed sidewalls of the recessed semiconductor channel nanosheets.

DETAILED DESCRIPTION

Figure 1A:
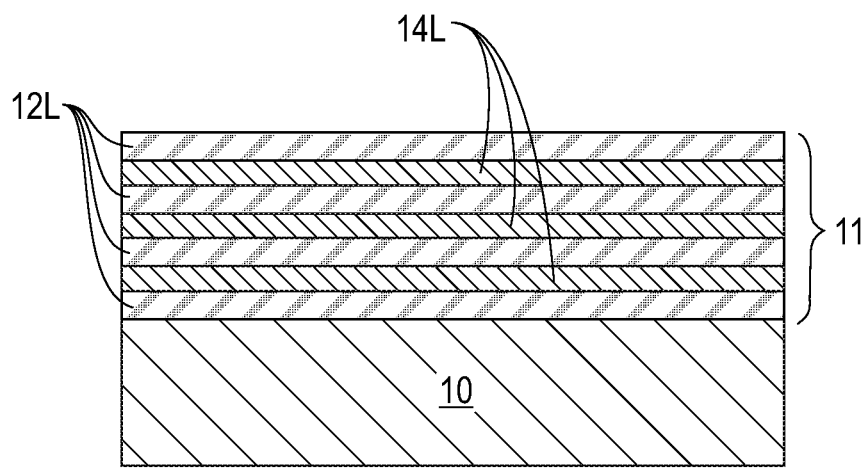
FIG. 1A is a cross sectional view of an exemplary semiconductor structure of the present application and during an early stage of fabrication, the exemplary structure including a semiconductor material stack structure of alternating layers of a sacrificial semiconductor material and a semiconductor channel material located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
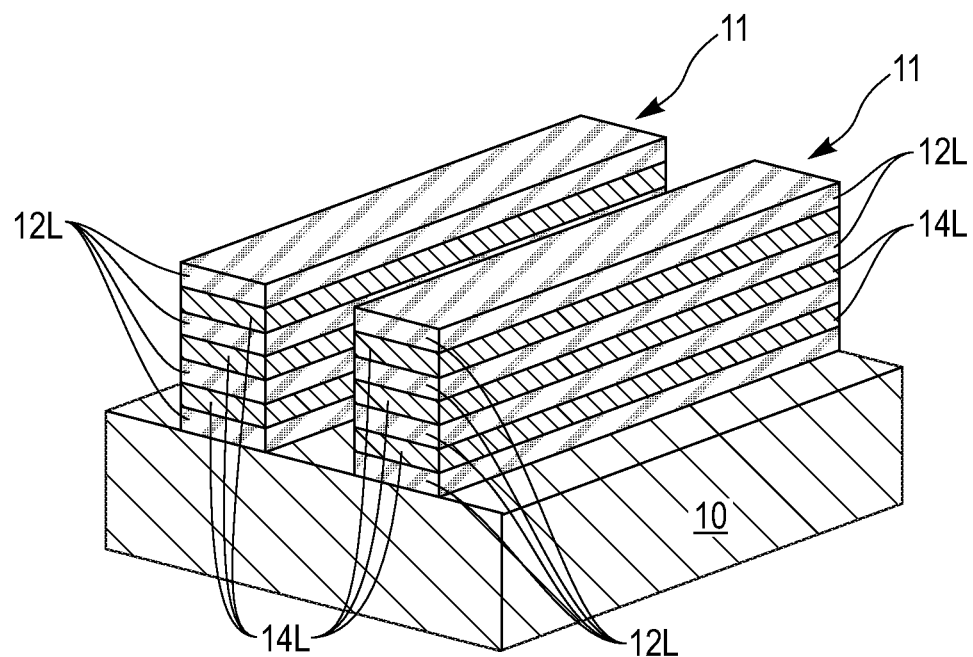
FIG. 1B is a three-dimensional view of the exemplary semiconductor structure of FIG. 1A.

Referring now to FIGS. 1A-1B, there are illustrated an exemplary semiconductor structure at an early stage of fabrication and in accordance with an embodiment of the present application. The exemplary semiconductor structure of FIG. 1 includes a semiconductor material stack structure 11 of alternating layers of a sacrificial semiconductor material 12L and a semiconductor channel material 14L on a surface of a semiconductor substrate 10. Although, FIG. 1B illustrates two semiconductor material stack structures 11 that are orientated parallel to each other, the present application is not limited to the formation of two semiconductor material stack structures 11. Instead, the present application can be employed when a single semiconductor material stack structure 11 is formed, or more than two semiconductor material stack structures 11 are formed.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. A SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Semiconductor material stack structure 11 is then formed upon the semiconductor substrate 10. As mentioned above, semiconductor material stack structure 11 includes alternating layers of a sacrificial semiconductor material 12L and a semiconductor channel material 14L stacked one atop the other and such that each layer of a semiconductor channel material 14L is located between a bottom layer of sacrificial semiconductor material 12L and a top layer of sacrificial semiconductor material 12L. In FIGS. 1A-1B and by way of one example, semiconductor material stack structure 11 includes four layers of sacrificial semiconductor material 12L and three layers of semiconductor channel material 14L. The semiconductor material stack structure 11 that can be employed in the present application is not limited to the specific embodiment illustrated in FIGS. 1A-1B. Instead, the semiconductor material stack structure 11 can include any number of layers of sacrificial semiconductor material 12L and corresponding layers of semiconductor channel material 14L provided that each layer of a semiconductor channel material 14L is located between a bottom layer of sacrificial semiconductor material 12L and a top layer of sacrificial semiconductor material 12L.

Each layer of sacrificial semiconductor material 12L is composed of a first semiconductor material which differs in composition from at least an upper portion of the semiconductor substrate 10. In one embodiment, the upper portion of the semiconductor substrate 10 is composed of silicon, while each layer of sacrificial semiconductor material 12L is composed of a silicon germanium alloy. The first semiconductor material that provides each layer of sacrificial semiconductor material 12L can be formed utilizing an epitaxial growth (or deposition process) as defined in greater detail herein below.

Each layer of semiconductor channel material 14L is composed of a second semiconductor material that has a different etch rate than the first semiconductor material that provides the first layers of sacrificial semiconductor material 12L. The second semiconductor material that provides each layer of semiconductor channel material 14L may be the same as, or different from, the semiconductor material that provides at least the upper portion of the semiconductor substrate 10. In one example, at least the upper portion of the semiconductor substrate 10 and each layer of semiconductor channel material 14L is composed of Si or a III-V compound semiconductor, while each layer of sacrificial semiconductor material 12L is composed of a silicon germanium alloy or a III-V compound semiconductor that is different from the one used as the semiconductor channel material 14L. The second semiconductor material that provides each layer of semiconductor channel material 14L can be formed utilizing an epitaxial growth (or deposition process) as defined in greater detail herein below.

Semiconductor material stack structure 11 can be formed by sequential epitaxial growth of alternating layers of the first semiconductor material and the second semiconductor material. Following epitaxial growth of the topmost layer of the semiconductor material stack structure 11 a patterning process may be used to provide the semiconductor material stack 11 shown in FIGS. 1A-1B. Patterning may be performed by lithography and etching or any other patterning method known to those skilled in the art including, for example, a sidewall-image transfer (SIT) process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials that provide the layers of sacrificial semiconductor material 12L and the layers of semiconductor channel material 14L, respectively, can be performed utilizing any well known precursor gas or gas mixture. Carrier gases like hydrogen, nitrogen, helium and argon can be used.

The term "semiconductor material stack structure" denotes a continuous fin-like structure including a pair of vertical sidewalls that are parallel to each other. As used herein, a surface is "vertical" if there exists a vertical plane from which the surface does not deviate by more than three times the root mean square roughness of the surface. Each layer of sacrificial semiconductor material 12L may have a thickness from 3 nm to 30 nm, while each layer of semiconductor channel material 14L may have a thickness from 3 nm to 20 nm. Each layer of sacrificial semiconductor material 12L may have a thickness that is the same as, or different from, a thickness of each layer of semiconductor channel material 14L.

Figure 2B:
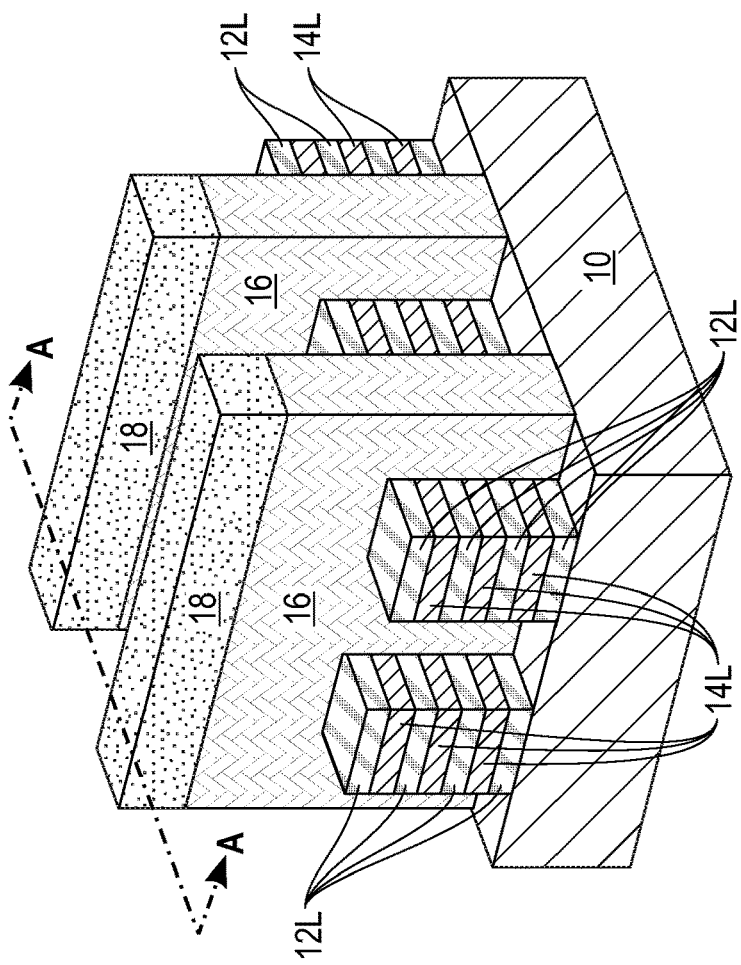
FIG. 2B is a three-dimensional view of the exemplary semiconductor structure of FIG. 2A.
Figure 2A:
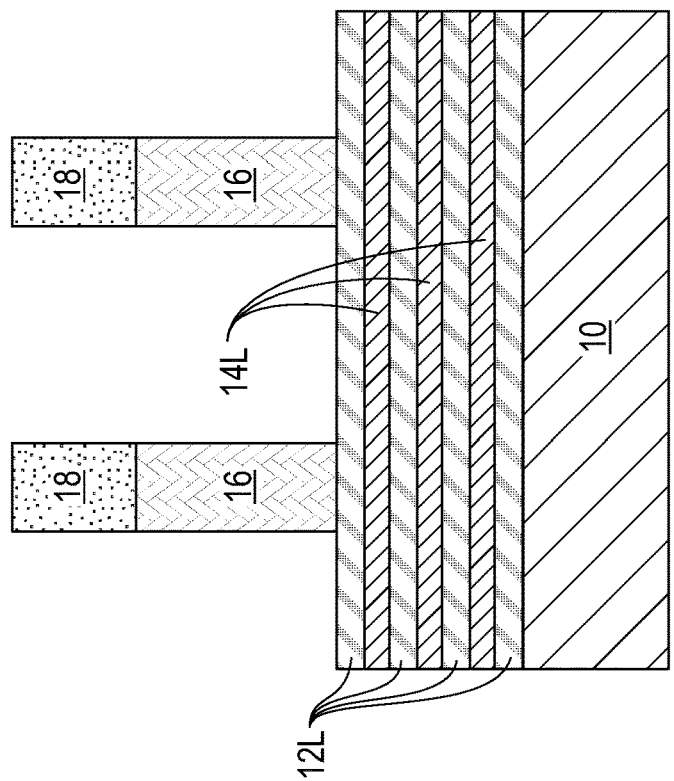
FIG. 2A is a cross sectional view of the exemplary semiconductor structure of FIGS. 1A-1B after forming a sacrificial gate structure on a surface of the semiconductor material stack structure.

Referring now to FIGS. 2A-2B, there is illustrated the exemplary semiconductor structure of FIGS. 1A-1B after forming a sacrificial gate structure on a surface of the semiconductor material stack structure 11. In the illustrated embodiment, the sacrificial gate structure includes a sacrificial gate portion 16 and a sacrificial dielectric cap portion 18; the sacrificial dielectric cap portion 18 is optional. In the drawings, two sacrificial gate structures (16/18) are shown by way of illustration only. The present application can work when a single sacrificial gate structure is formed, or more than two sacrificial gate structures are formed.

Each sacrificial gate structure (16/18) is located on a first side and a second side of the material stack structure 11 and spans across a topmost surface of a portion of the semiconductor material stack structure 11. Each sacrificial gate structure (16/18) thus straddles over a portion of the semiconductor material stack structure 11.

Each sacrificial gate structure may include a single sacrificial material portion or a stack of two or more sacrificial material portions (i.e., at least one sacrificial material portion). In one embodiment, the at least one sacrificial material portion comprises, from bottom to top, a sacrificial gate dielectric portion (not shown), a sacrificial gate portion 16 and a sacrificial dielectric cap portion 18. In some embodiments, the sacrificial gate dielectric portion and/or the sacrificial dielectric cap portion 18 can be omitted and only a sacrificial gate portion 16 is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure (16, 18). The remaining portions of the sacrificial gate dielectric material constitute a sacrificial gate dielectric portion (not shown), the remaining portions of the sacrificial gate material constitute a sacrificial gate portion 16, and the remaining portions of the sacrificial gate cap material constitute a sacrificial dielectric cap portion 18.

Figure 3:
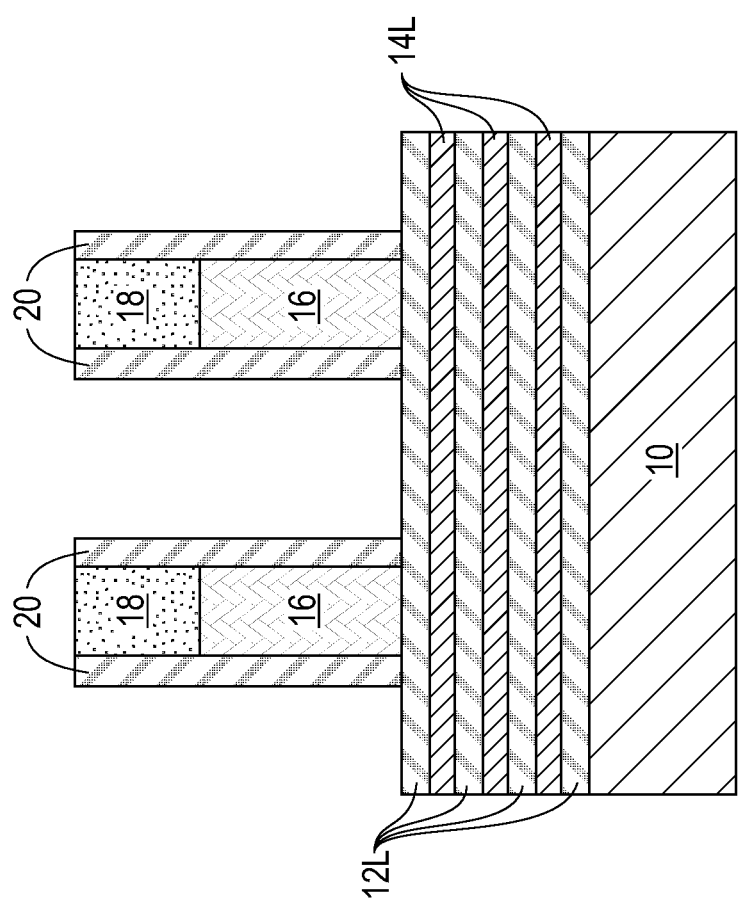
FIG. 3 is a cross sectional view of the exemplary semiconductor structure of FIGS. 2A-2B after forming a dielectric spacer on a sidewall of the sacrificial gate structure and on a surface of the semiconductor material stack structure.

Referring now to FIG. 3, there is illustrated the exemplary semiconductor structure of FIGS. 2A-2B after forming a dielectric spacer 20 on a sidewall of the sacrificial gate structure (16, 18) and on a surface of the semiconductor material stack structure 11. It is noted that the dielectric spacer 20 also spans across the semiconductor material stack structure 11. The dielectric spacer 20 can be formed by first providing a dielectric spacer material and then etching the dielectric spacer material. Examples of dielectric spacer materials that may be employed in the present application are silicon nitride (SiN), siliconboron carbonitride (SiBCN), or silicon oxycarbonitride (SiOCN). The dielectric spacer material that provides the dielectric spacer 20 may be provided by a deposition process including, for example, chemical vapor deposition (CVD), plasma enhanced chemical vapor deposition (PECVD), or physical vapor deposition (PVD). The etch used to provide the dielectric spacer 20 may comprise a dry etching process such as, for example, reactive ion etching.

Figure 4:
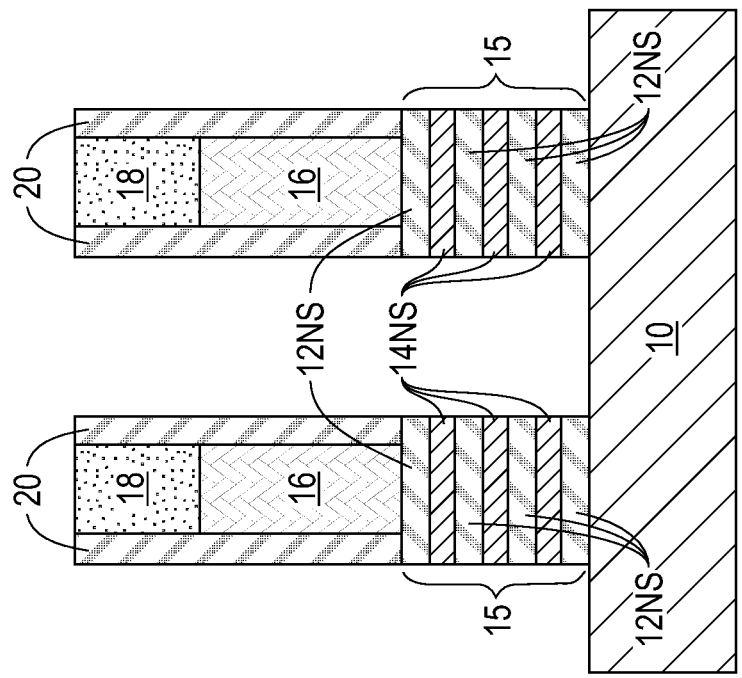
FIG. 4 is a cross sectional view of the exemplary semiconductor structure of FIG. 3 after removing physically exposed portions of the semiconductor material stack structure that are not protected by sacrificial gate structure and the dielectric spacer to provide a nanosheet material stack of alternating nano sheets of the sacrificial semiconductor material and the semiconductor channel material located beneath the sacrificial gate structure and the dielectric spacer.

Referring now to FIG. 4, there is illustrated the exemplary semiconductor structure of FIG. 3 after removing physically exposed portions of the semiconductor material stack structure 11 that are not protected by sacrificial gate structure (16/18) and the dielectric spacer 20 to provide a nanosheet material stack 15 of alternating nanosheets of the sacrificial semiconductor material and the semiconductor channel material located beneath the sacrificial gate structure (16/18) and the dielectric spacer 20.

The removal of the physically exposed portions of the semiconductor material stack 11 not covered by the sacrificial gate structure (16/18) and the dielectric spacer 20 can be performed utilizing an anisotropic etching process such as, for example, reactive ion etching (RIE). A portion of the semiconductor material stack 11 remains beneath the sacrificial gate structure (16/18) and the dielectric spacer 20. The remaining portion of the semiconductor material stack structure 11 that is presented beneath the sacrificial gate structure (16/18) and the dielectric spacer is referred to as nanosheet material stack 15.

Nanosheet material stack 15 includes alternating nanosheets of remaining portions of each layer of sacrificial semiconductor material (referred to herein as a sacrificial semiconductor material nanosheet 12NS) and remaining portions of each layer of semiconductor channel material (referred to herein as a semiconductor channel material nanosheet 14NS).

Each nanosheet, i.e., sacrificial semiconductor material nanosheet 12NS and semiconductor channel material nanosheet 14NS, that constitutes the nanosheet material stack 15 has a thickness as mentioned above for the layers of sacrificial semiconductor material 12L and semiconductor channel material 14L, a length from 10 nm to several µms, and a width (into the page) from 5 nm to 150 nm. At this point of the present application and as illustrated in FIG. 4, the sidewalls of each sacrificial semiconductor material nanosheet 12NS are vertically aligned to sidewalls of each semiconductor channel material nanosheet 14NS, and the vertically aligned sidewalls of the nanosheet material stack 15 are vertically aligned to an outmost sidewall of the dielectric spacer 20.

Figure 5:
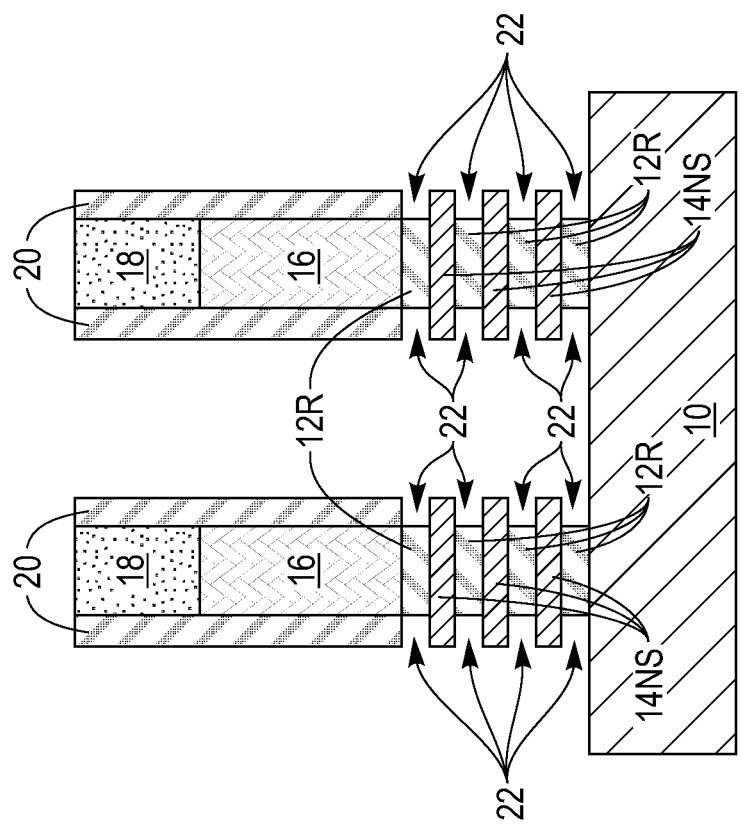
FIG. 5 is a cross sectional view of the exemplary semiconductor structure of FIG. 4 after recessing each of the sacrificial semiconductor material nanosheets.

Referring now to FIG. 5, there is illustrated the exemplary semiconductor structure of FIG. 4 after recessing each of the sacrificial semiconductor material nanosheets 12NS. Each recessed sacrificial semiconductor material nanosheet is designated as element 12R in the drawings of the present application. Each recessed sacrificial semiconductor material nanosheet 12R has a length that is less than the original length of each sacrificial semiconductor material nanosheet 12NS. The recessing of each sacrificial semiconductor material nanosheet 12NS provides a gap 22 between each neighboring pair of semiconductor channel material nanosheets 14NS within a given nanosheet material stack 15; a gap is also formed between the bottommost semiconductor channel material nanosheet 14NS and the semiconductor substrate 10. The recessing of each sacrificial semiconductor material nanosheet 12NS may be performed utilizing a lateral etching process that is selective in removing physically exposed end portions of each sacrificial semiconductor material nanosheet 12NS relative to each semiconductor channel material nanosheet 14NS.

Figure 6:
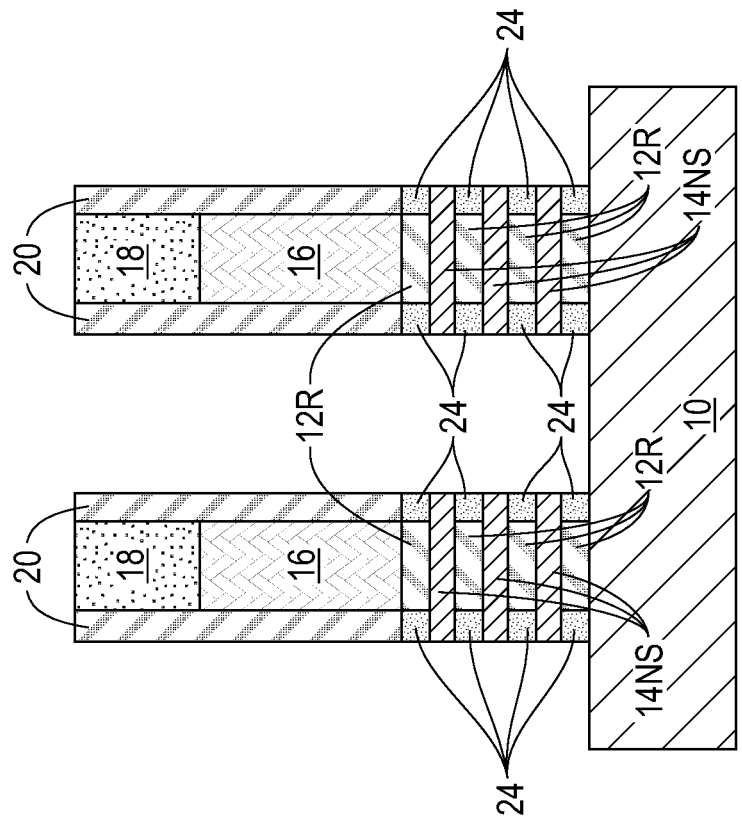
FIG. 6 is a cross sectional view of the exemplary semiconductor structure of FIG. 5 after forming an inner dielectric spacer on physically exposed sidewalls of each of the recessed sacrificial semiconductor material nanosheets.

Referring now to FIG. 6, there is illustrated the exemplary semiconductor structure of FIG. 5 after forming an inner dielectric spacer 24 on physically exposed sidewalls of each of the recessed sacrificial semiconductor material nanosheets 12R. The inner dielectric spacer 24 is formed with each gap 22 provided in FIG. 5. The inner dielectric spacer 24 is formed by deposition of a dielectric spacer material and etching the deposited dielectric spacer material. The dielectric spacer material that provides the inner dielectric spacer 24 may be the same as, or different from, the dielectric spacer material that provides the dielectric spacer 20. As is shown, the inner dielectric spacer 24 has an innermost sidewall that directly contacts a sidewall of one of the recessed sacrificial semiconductor material nanosheets 12R, and an outermost sidewall that is vertically aligned with the sidewalls of each of semiconductor channel material nanosheets 14NS, and the dielectric spacer 20.

Figure 7:
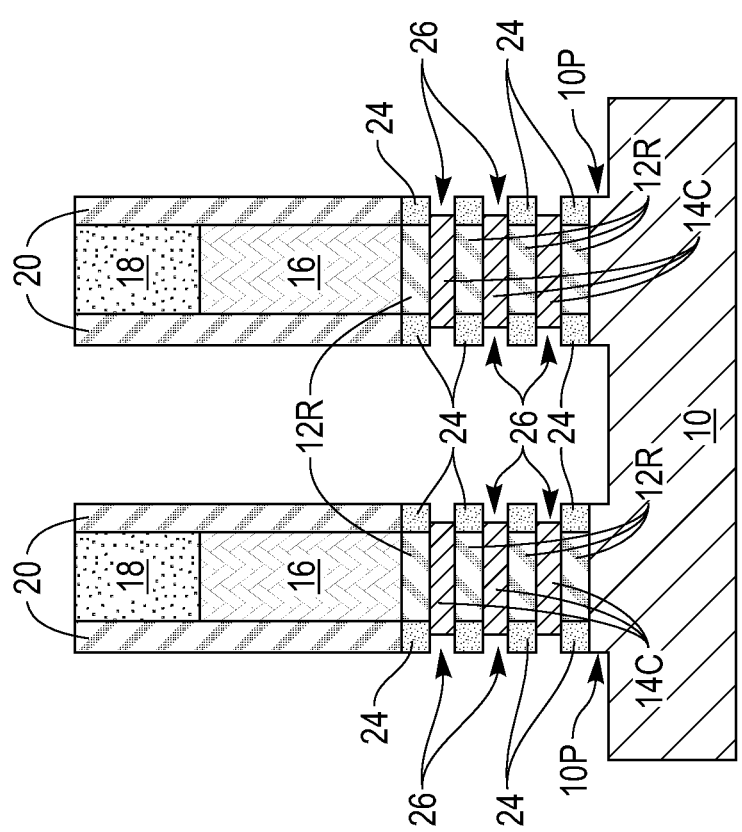
FIG. 7 is a cross sectional view of the exemplary semiconductor structure of FIG. 6 after recessing each of the semiconductor channel material nanosheets.

Referring now to FIG. 7, there is illustrated the exemplary semiconductor structure of FIG. 6 after recessing each of the semiconductor channel material nanosheets 14NS. Each recessed semiconductor channel material nanosheet may be referred to as a semiconductor channel nanosheet 14C. Each semiconductor channel nanosheet 14C has a length that is less than the original length of each semiconductor channel material nanosheet 14NS, and a length that may be greater or less than the length of each recessed sacrificial semiconductor material nanosheet 12R. During this step of the present application, the semiconductor substrate 10 may be recessed to provide a recessed surface that is located laterally adjacent a pedestal portion 10P of the semiconductor substrate 10.

The recessing of each semiconductor channel material nanosheet 14NS also provides a gap 26 between each neighboring pair of inner dielectric spacers 24. The recessing of each semiconductor channel material nanosheet 14NS may be performed utilizing a lateral etching process that is selective in removing physically exposed end portions of each semiconductor channel material nanosheet 14NS relative to each recessed sacrificial semiconductor material nanosheet 12R.

Figure 8:
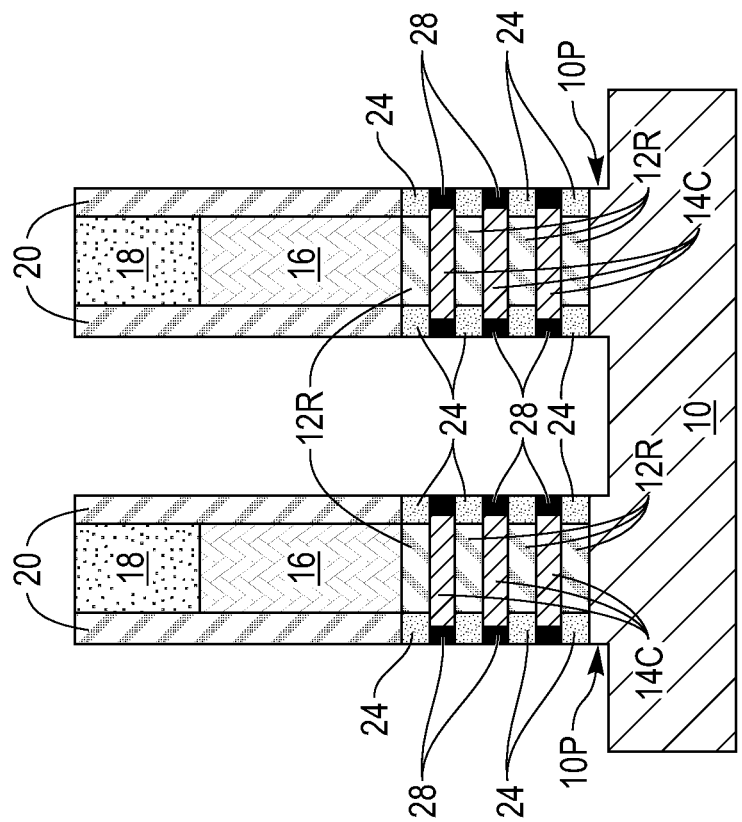
FIG. 8 is a cross sectional view of the exemplary semiconductor structure of FIG. 7 after forming a sacrificial inner dielectric spacer on physically exposed sidewalls of each of the recessed semiconductor channel material nanosheets.

Referring now to FIG. 8, there is illustrated the exemplary semiconductor structure of FIG. 7 after forming a sacrificial inner dielectric spacer 28 on physically exposed sidewalls of each of the recessed semiconductor channel material nanosheets (i.e., each semiconductor channel nanosheet 14C). The sacrificial inner dielectric spacer 28 is formed within each gap 26 provided in FIG. 7. The sacrificial inner dielectric spacer 28 is formed by deposition of a dielectric spacer material and etching the deposited dielectric spacer material. The dielectric spacer material that provides the sacrificial inner dielectric spacer 28 is different from the dielectric spacer material that provides both of the dielectric spacer 20 and the inner dielectric spacer 24. As is shown, the sacrificial inner dielectric spacer 28 has an innermost sidewall that directly contacts a sidewall of one of the semiconductor channel nanosheets 14C, and an outermost sidewall that is vertically aligned with the sidewalls of each of the inner dielectric spacers 24 and the dielectric spacer 20.

Figure 9:
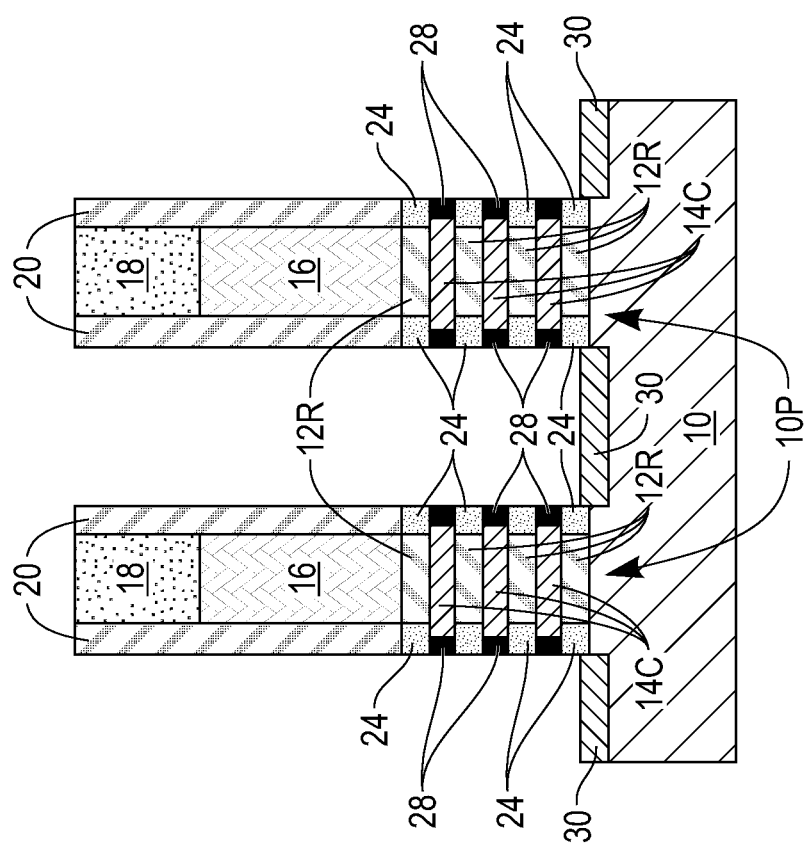
FIG. 9 is a cross sectional view of the exemplary semiconductor structure of FIG. 8 after forming a local isolation region on a surface of the semiconductor substrate and at the footprint of (i.e., adjacent to) the nanosheet material stack.

Referring now to FIG. 9, there is illustrated the exemplary semiconductor structure of FIG. 8 after forming a local isolation region 30 on a surface of the semiconductor substrate 10 and at the footprint of (i.e., adjacent to) the nanosheet material stack 15. In some embodiments, and as is illustrated, the local isolation region 30 is formed on a recessed surface of the semiconductor substrate 10 and laterally adjacent the pedestal portion 10P of the semiconductor substrate 10. The local isolation region 30 has a topmost surface that is located beneath a topmost surface of a bottommost inner dielectric spacer 24 and above a topmost surface of the pedestal portion 10P of the semiconductor substrate 10.

The local isolation region 30 is formed selectively by an epitaxial growth process on the exposed surface of the semiconductor substrate 10; the local isolation region may be referred to as an epitaxial isolation region since epitaxy is used to form the same. No local isolation region 30 forms on, and outward from, the semiconductor channel nanosheets 14C and the recessed sacrificial semiconductor material nanosheets 12R since the same are protected by an inner spacer.

In one embodiment, the local isolation region 30 is composed of an epitaxial oxide which has a lattice dimension substantially similar (i.e., ±5%) to the lattice dimension of an upper portion of the semiconductor substrate 10, thus the epitaxial oxide (and hence the local isolation region 30) is said to be lattice matched to the upper portion of the semiconductor substrate 10. The epitaxial oxide is epitaxially deposited, as defined above. Examples of epitaxial oxides that are suitable for use as the epitaxial oxide may include binary oxides, such as, e.g., lanthanum (II) oxide ($La_2O_3$) gadolinium(III)-oxide ($Gd_2O_3$), dysprosium(III)-oxide ($Dy_2O_3$), holmium(III) oxide ($Ho_2O_3$), erbium (III) oxide ($Er_2O_3$), thulium (III) oxide ($Tm_2O_3$), lutetium(III) oxide ($Lu_2O_3$) or cerium (IV) oxide ($CeO_2$), ternary oxides including a rare earth metal, such as e.g., Gd, Er, Nd, La and Y forming oxides such as, e.g., lanthanum-yttrium oxide (($La_xY_{1-x})_2O_3$), gadolinium-erbium oxide (($Gd_xEr_{1-x})_2O_3$), neodymium-erbium oxide (($Nd_xEr_{1-x})_2O_3$), neodymium-gadolinium oxide (($Nd_xGd_{1-x})_2O_3$), lanthanum-erbium oxide (($La_xEr_{1-x})_2O_3$), or any combination thereof. In one embodiment, the epitaxial oxide is composed of ($La_xY_{1-x})_2O_3$ alloy in which x is 0.33.

In another embodiment, the local isolation region 30 is composed a semi-insulating wide-band gap semiconductor such as, for example, chromium (Cr) doped GaP. The semi-insulating wide-band gap semiconductor is formed utilizing an epitaxial growth process as defined above. The dopant is introduced in-situ during the epitaxial growth process.

Figure 10:
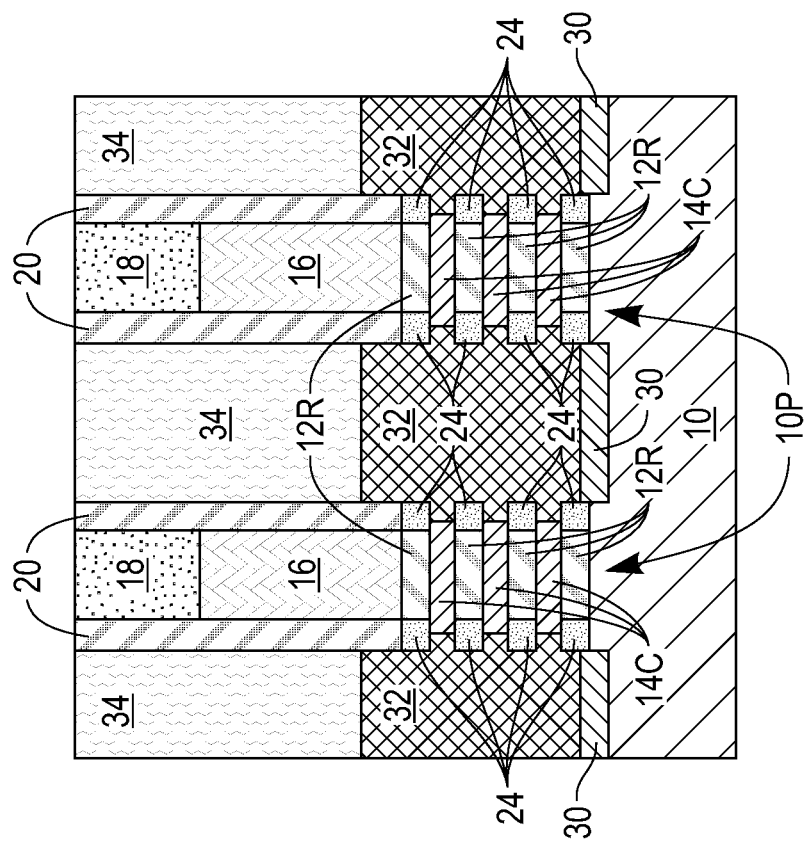
FIG. 10 is a cross sectional view of the exemplary semiconductor structure of FIG. 9 after forming a source/drain structure on each side of the nanosheet material stack, and forming an interlayer dielectric (ILD) material layer on the source/drain structure.

Referring now to FIG. 10, there is illustrated the exemplary semiconductor structure of FIG. 9 after forming a source/drain structure 32 on each side of the nanosheet material stack 15, and forming an interlayer dielectric (ILD) material layer 34 on the source/drain structure 32.

Each source/drain (S/D) structure 32 can be formed by first removing each sacrificial inner dielectric spacer 28 to physically expose a sidewall of the semiconductor channel nanosheets 14C. Each sacrificial inner dielectric spacer 28 may be removed utilizing an etching process that is selective in removing the sacrificial inner dielectric spacer 28. The inner dielectric spacers 24 are not removed during this etching. After removal of each sacrificial inner dielectric spacer 28, a S/D structure 32 composed of a doped semiconductor material is epitaxially grown on the physically exposed sidewall of each of the semiconductor channel nanosheet 14C. Each S/D structure 32 entirely fills in gap 26 that previously included sacrificial inner dielectric spacer 28. Thus, each S/D structure 32 is in close proximity to one of the semiconductor channel nanosheets 14C and a portion of each S/D structure 32 is located in an undercut defined by gap 26 that is present beneath the inner dielectric spacers 14. That is, a portion of the S/D structure 32 is present in gap 26 that is located between each neighboring pair of vertically spaced apart inner dielectric spacers 24. In the present application, and due to the proximity of the S/D structure 32 to the semiconductor channel material nanosheets 14C, less or no thermal budget is needed to drive in the source/drain dopants into the channel region, thus a sharp junction is formed.

In the present application, the semiconductor material that provides the S/D structure 32 grows laterally out from a sidewall of each of the semiconductor channel nanosheets 14C. The S/D structures 32 have a bottommost surface that directly contacts a topmost surface of the local isolation structure 30. In some embodiments, each S/D structure 32 has a faceted upper surface.

Each S/D structure 32 includes a semiconductor material and a dopant. The semiconductor material that provides each S/D structure 32 can be selected from one of the semiconductor materials mentioned above for the semiconductor substrate 10. In some embodiments, the semiconductor material that provides each S/D structure 32 may comprise a same semiconductor material as that which provides each semiconductor channel material nanosheet 14NS. In other embodiments of the present application, the semiconductor material that provides each S/D structure 32 may comprise a different semiconductor material than that which provides each semiconductor channel material nanosheet 14NS. For example, the semiconductor material that provides each S/D structure 32 may be composed of silicon germanium alloy, while each semiconductor channel material nanosheet 14NS may be composed of silicon.

The dopant that is present in each S/D structure 32 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the doped semiconductor material provides each S/D structure 32 comprises silicon or a silicon germanium alloy that has a dopant concentration of from $1 \times 10^{19}$ atoms/cm$^3$ to $5 \times 10^{21}$ atoms/cm$^3$.

In one embodiment, the dopant that can be present in the each S/D structure 32 can be introduced into the precursor gas that provides each S/D structure 32. In another embodiment, the dopant can be introduced into an intrinsic semiconductor layer by utilizing one of ion implantation or gas phase doping. In one example, each S/D structure 32 comprises a silicon germanium alloy that is doped with a p-type dopant such as, for example, boron. As mentioned above, each S/D structure 32 is formed by an epitaxial growth (or deposition) process, as is defined above.

ILD material layer 34 is then formed on each source/drain structure 32. The ILD material layer 34 surrounds the nanosheet material stack containing the recessed sacrificial semiconductor nanosheets 12R and the semiconductor channel nanosheets 14C. The ILD material layer 34 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 34. The use of a self-planarizing dielectric material as the ILD material layer 34 may avoid the need to perform a subsequent planarizing step.

In one embodiment, the ILD material layer 34 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 34, a planarization process or an etch back process follows the deposition of the dielectric material that provides the ILD material layer 34.

Figure 11:
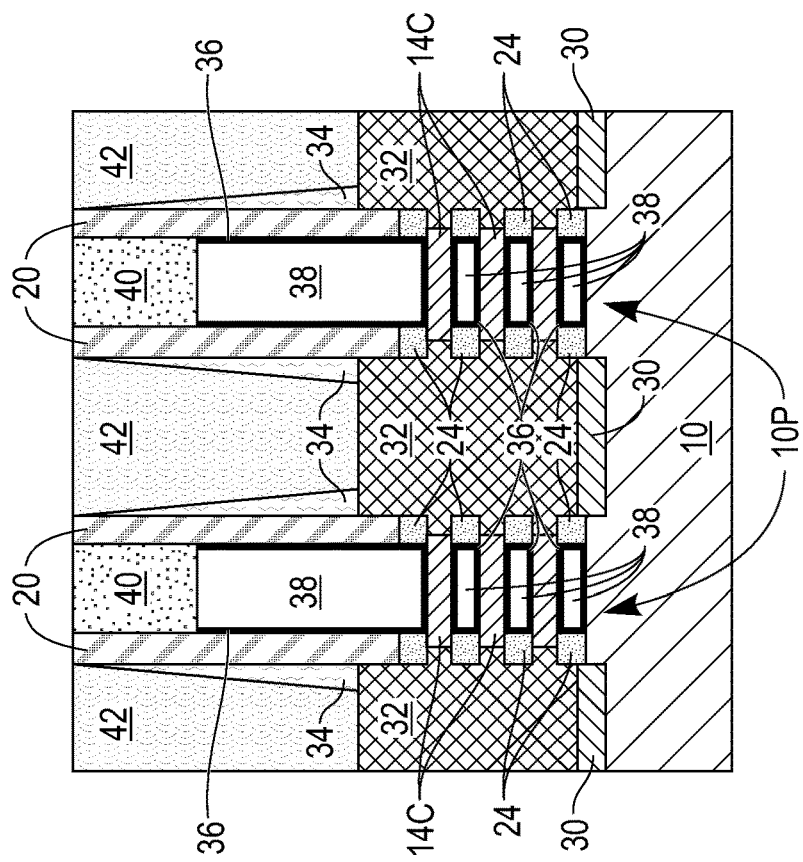
FIG. 11 is a cross sectional view of the exemplary semiconductor structure of FIG. 10 after removing the sacrificial gate structure and each recessed sacrificial semiconductor material nanosheet, and forming a functional gate structure wrapped around each recessed semiconductor channel material nanosheet and in an area previously including the recessed sacrificial semiconductor material nanosheets and the sacrificial gate structure.

Referring now to FIG. 11, there is illustrated the exemplary semiconductor structure of FIG. 10 after removing the sacrificial gate structure and each recessed sacrificial semiconductor material nanosheet (i.e., each semiconductor channel nanosheet 14C), and forming a functional gate structure (36, 38) wrapped around each recessed semiconductor channel material nanosheet (i.e., each semiconductor channel nanosheet 14C) and in an area previously including the recessed sacrificial semiconductor material nanosheets 12R and the sacrificial gate structure 16. In some embodiments, a dielectric cap 40 is formed on a topmost surface of the functional gate structure (36, 38).

The sacrificial gate structure (16/18) can be removed utilizing one or more anisotropic or isotropic etching processes. Next, each semiconductor channel nanosheet 14C is suspended by selectively etching each recessed sacrificial semiconductor material nanosheet 12R relative to each semiconductor channel nanosheet 14C. Functional gate structure (36, 38) is then formed in each gate cavity and surrounding a physically exposed surface of each semiconductor channel nanosheet 14CS. By "functional gate structure" it is meant a permanent gate structure used to control output current (i.e., flow of carriers in the channel) of a semiconducting device through electrical or magnetic fields.

The functional gate structure (36, 38) may include a gate dielectric portion 36 and a gate conductor portion 38. The gate dielectric portion 36 may include a gate dielectric material. The gate dielectric material that provides the gate dielectric portion 36 can be an oxide, nitride, and/or oxynitride. In one example, the gate dielectric material that provides the gate dielectric portion 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 36. When multiple functional gate structures are formed, the gate dielectric portion 36 of each functional gate structure may be composed of a same, or a different, gate dielectric material.

The gate dielectric material used in providing the gate dielectric portion 36 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material used in providing the gate dielectric portion 36 can have a thickness in a range from 1 nm to 10 nm. Other thicknesses that are lesser than, or greater than, the aforementioned thickness range can also be employed for the gate dielectric material that may provide the gate dielectric portion 36.

The gate conductor portion 38 can include a gate conductor material. The gate conductor material used in providing the gate conductor portion 38 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), an elemental metal carbide (e.g., titanium carbide and titanium carbide doped with aluminum) or multilayered combinations thereof. In one embodiment, the gate conductor portion 38 may comprise an nFET gate metal. In another embodiment, the gate conductor portion 38 may comprise a pFET gate metal. When multiple functional gate structures are formed, it is possible to form an nFET gate metal wrapping around a first set of suspended semiconductor channel nanosheets 14C, and a pFET gate metal wrapping around a second set of suspended semiconductor channel nanosheets 14C.

The gate conductor material used in providing the gate conductor portion 38 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 38 can have a thickness from 50 nm to 200 nm. Other thicknesses that are lesser than, or greater than, the aforementioned thickness range can also be employed for the gate conductor material used in providing the gate conductor portion 38.

The functional gate structure (36, 38) can be formed by providing a functional gate material stack of the gate dielectric material, and the gate conductor material. A planarization process may follow the formation of the functional gate material stack. In some embodiments, the functional gate structure (36, 38) has a topmost surface that is coplanar with a topmost surface of the ILD material layer 34. In other embodiments, the functional gate structure (36, 38) is recessed and then dielectric cap 40 is formed on a topmost surface of the functional gate structure (36, 38). The dielectric cap 40 may include one of the sacrificial gate cap materials mentioned above, and can be formed utilizing a deposition proves such as, for example, chemical vapor deposition (CVD) or plasma enhanced chemical vapor deposition (PECVD). A planarization process may follow the deposition process.

The semiconductor structure illustrated in FIG. 11 includes a plurality of stacked and suspended semiconductor channel nanosheets 14C located above a semiconductor substrate 10. A functional gate structure (36, 38) surrounds a portion of each semiconductor channel nanosheet 14C of the plurality of stacked and suspended semiconductor channel nanosheets. An inner dielectric spacer 24 is located on a sidewall of the functional gate structure (36, 38) and is present above and beneath each semiconductor channel nanosheet 14C of the plurality of stacked and suspended semiconductor channel nanosheets. A source/drain (S/D) structure 32 is located on each side of the functional gate structure (36, 38). In accordance with the present application, a portion of the S/D structure 32 physically contacts a sidewall of each of the semiconductor channel nanosheets 14C and is present in a gap located between each neighboring pair of vertically spaced apart inner dielectric spacers 24. A local isolation region 30 is present between the source/drain structure 32 and the semiconductor substrate 10.

Due to the presence of the local isolation region 30, parasitic leakage current under the plurality of stacked and suspended semiconductor channel nanosheets 14C is prevented. Also, the source/drain structure 32 is in close proximity to each of the semiconductor channel nanosheets 14C.

Figure 12:
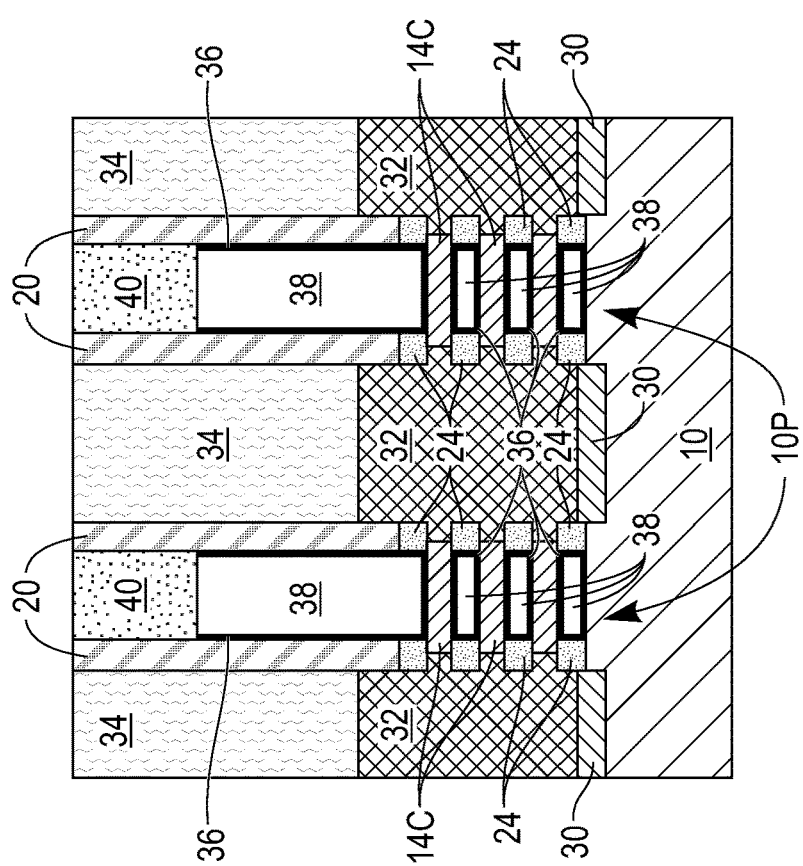
FIG. 12 is a cross sectional view of the exemplary semiconductor structure of FIG. 11 after forming contact structures.

Referring now to FIG. 12, there is illustrated the exemplary semiconductor structure of FIG. 11 after forming contact structures 42. The contact structures 42 can be formed by first providing contact openings to expose each source/drain structure 32. The contact openings can be formed by lithography and etching. Each contact opening is the filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The contact structures 42 are embedded in the ILD material layer 34.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of stacked and suspended semiconductor channel nanosheets located above a semiconductor substrate;
a functional gate structure surrounding a portion of each semiconductor channel nanosheet of the plurality of stacked and suspended semiconductor channel nanosheets, wherein a bottommost surface of the functional gate structure that is located beneath a bottommost semiconductor channel nanosheet of the plurality of stacked and suspended semiconductor channel nanosheets directly contacts the semiconductor substrate;
an inner dielectric spacer located on a sidewall of the functional gate structure and present above and beneath each semiconductor channel nanosheet of the plurality of stacked and suspended semiconductor channel nanosheets;
a source/drain (S/D) structure located on each side of the functional gate structure, wherein a portion of the S/D structure physically contacts a sidewall of each of the semiconductor channel nanosheets and is present in a gap located between each neighboring pair of vertically spaced apart inner dielectric spacers; and
a local isolation region present between the source/drain structure and the semiconductor substrate, wherein an entirety of a topmost surface of the local isolation region directly contacts a bottommost surface of the S/D structure, and wherein at least a portion of a sidewall of the local isolation region directly contacts a sidewall of a bottommost inner dielectric spacer that is located beneath the bottommost semiconductor channel nanosheet of the plurality of stacked and suspended semiconductor channel nanosheets.

2. The semiconductor structure of claim 1, wherein the local isolation region is composed of an epitaxial oxide that is lattice matched to an upper portion of the semiconductor substrate.

3. The semiconductor structure of claim 2, wherein the epitaxial oxide is composed of lanthanum (II) oxide, gadolinium(III)-oxide, dysprosium(III)-oxide, holmium(III) oxide, erbium (III) oxide, thulium (III) oxide, lutetium(III) oxide, cerium (IV) oxide, lanthanum-yttrium oxide, gadolinium-erbium oxide, neodymium-erbium oxide, neodymium-gadolinium oxide, or lanthanum-erbium oxide.

4. The semiconductor structure of claim 1, wherein the local isolation region is composed of a semi-insulating wide bandgap semiconductor material.

5. The semiconductor structure of claim 4, wherein the semi-insulating wide bandgap semiconductor material is composed of chromium doped GaP.

6. The semiconductor structure of claim 1, wherein the local isolation region is present on a recessed surface of the semiconductor substrate.

7. The semiconductor structure of claim 1, wherein the plurality of stacked and suspended semiconductor channel nanosheets is located on a pedestal portion of the semiconductor substrate.

8. The semiconductor structure of claim 1, further comprising an interlayer dielectric material layer on the source/drain structure.

9. The semiconductor structure of claim 8, further comprising a contact structure contacting a surface of the source/drain structure and embedded in the interlayer dielectric material.

* * * * *